United States Patent [19]

Masaki et al.

[11] Patent Number: 5,326,792
[45] Date of Patent: Jul. 5, 1994

[54] POLYIMIDE PHOTOSENSITIVE COVER COATING AGENT

[75] Inventors: Yoshinori Masaki; Kouichi Kunimune, both of Ichiharashi; Hirotoshi Maeda, Yokohamashi, all of Japan

[73] Assignee: Chisso Corporation, Osaka, Japan

[21] Appl. No.: 980,164

[22] Filed: Nov. 23, 1992

[30] Foreign Application Priority Data

Dec. 9, 1991 [JP] Japan .................................. 3-350325

[51] Int. Cl.$^5$ .......................... C08F 2/48; C08J 3/28; C08G 73/10
[52] U.S. Cl. .................................... 522/135; 522/136; 522/137; 522/142; 522/144; 522/164; 522/166; 522/14; 428/209; 430/283
[58] Field of Search .................. 522/14, 35, 904, 905, 522/135, 137, 142, 144, 164, 166, 65, 136; 428/209; 430/283

[56] References Cited

U.S. PATENT DOCUMENTS 4,284,707 8/1981 Nagasawa et al. .................. 522/109
4,629,685 12/1986 Pfeifer ................................. 522/162

FOREIGN PATENT DOCUMENTS 8043449 3/1983 Japan .................................. 522/164
0062661 4/1984 Japan .................................. 522/135
2007762 1/1987 Japan .................................. 522/164

Primary Examiner—Susan Berman
Attorney, Agent, or Firm—Fred Philpitt

[57] ABSTRACT

A photosensitive cover coating agent forming an insulating, protective coating having superior compatibility, sensitivity, heat resistance, adhesion, electrical properties and flexibility is provided, which coating agent is obtained by mixing a polymer (A) of repetition units of the formula

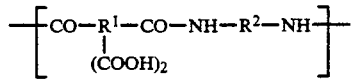

wherein $R^1$ is

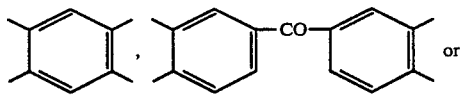

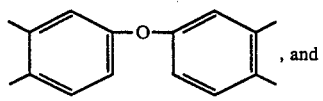 , and $R^2$ is a divalent organic group,
a compound (B) containing two or more (meth)acryloyl groups in one molecule,
a compound (C) of the formula

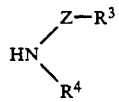

wherein Z is a divalent aliphatic or alicyclic group, $R^3$ is H, monovalent organic group or characteristic group and $R^4$ is H or $-Z-R^3$, in 0.01 to 0.80 mol equivalent based on compound (B), the total quantity of (B) and (C) being 20 to 200 wt. parts per 100 wt. parts of (A), and
a photopolymerization initiator or a sensitizing agent (D), in 0.5 to 20 wt. parts per 100 wt. parts of (A).

3 Claims, No Drawings

POLYIMIDE PHOTOSENSITIVE COVER COATING AGENT

BACKGROUND OF THE INVENTION

Field of the Invention

This invention relates to a photosensitive cover coating agent used for coating flexible circuit bases. More particularly, it relates to a photosensitive cover coating agent which is easily produced and superior in compatibility, sensitivity, heat resistance, flexibility, adhesion and electrical properties.

Description of the Related Art

It has been required for the insulating protective coating for printed wiring board to satisfy any characteristics of heat resistance sufficiently endurable to solder immersion, firm adhesion onto circuit base and electrical insulating properties, and in the case of flexible printed wiring board, it has been further required to satisfy flexibility in addition to the above-mentioned characteristics.

Heretofore, cover lay film has been used as insulating protective film for printed wiring board. As to this film, an adhesive is coated onto one side surface of polyimide or polyester film, followed by boring only a terminal-connecting part by means of punching or the like, positioning the part onto a circuit base by hand operation and adhering the film at a high temperature and under a high pressure by means of hot plate pressing.

According to the process, the resulting film is superior in the flexibility and advantageous in the aspect of circuit protection, but a problem has been raised. For example, in order to lead the terminal of the wiring board, it is necessary to punch the cover lay film in advance and thereby bore small holes. Thus, the cost of mold preparation by means of CAD and the plant cost for hot plate processing become high. Further, when the circuit is complicated, the positioning onto the wiring board becomes difficult. Still further, when an adhesive is applied, smears are liable to occur at the time of boring process by means of drill or the like and there is a fear that the adhesive exudes out at the time of pressing.

Furthermore, as to the performance of the adhesive, itself, a problem has been raised that there has not been found any adhesive which sufficiently adheres onto both the cover lay film such as polyimide film and the surface of the printed wiring board, and is also superior in the heat resistance and the electrical properties. Thus, even if the physical properties of the film itself are good, there has been a fear that use of the adhesive degenerates the above physical properties.

On the other hand, a process of forming an insulating protective film on the printed wiring board according to a printing method (cover lay ink) has been developed. However, a cover lay inking agent having been presently used is the one having applied a solder resist, so far used for rigid base; hence there has been a problem that the agent is inferior in the flexibility and insufficient in the heat resistance, electrical properties and adhesion onto the base. Further, since the reactivity of the resin is rapid, it has very often been used in a two-part form; hence its handling is cumbersome, and the pot life after mixing of the two parts is so short that a problem of storage stability has been raised.

For example, Japanese patent application laid-open No. Sho 55-145717 discloses a composition consisting of an epoxy acrylate resin and a melamine resin, but the composition has a disadvantage of poor flexibility.

Further, Japanese patent publication Nos. Sho 50-4395 and Sho 53-10636 disclose acrylic resin compositions of sulfomethylene acrylate, phosphoric acid ethylene acrylate, etc., but while any of them are relatively good in the flexibility, they are notably inferior in the heat resistance.

Further, Japanese patent application laid-open Nos. Sho 57-168909 and Sho 62-69262 disclose maleimide photosensitive resin compositions, but while they are superior in the heat resistance, they are inferior in the flexibility.

Further, the pattern dimension is limited due to positioning of the cover lay film on the wiring board, exudation of adhesive at the time of pressing, etc. Similarly, in the case where an insulating protective film is formed according to printing method of cover lay ink, the pattern dimension has a limitation of 100 $\mu$m, due to the positioning on the wiring board, exudation, sagging, etc. of the pattern. Such a limitation cannot correspond to pattern fining of circuit base to be required in future.

On the other hand, a fining process by means of a lithography process using a photosensitive material is a technique capable of sufficiently corresponding to pattern fining of circuit base. The photosensitive material includes highly heat-resistant, photosensitive polyimides. Most of these polyimides are a material obtained by introducing a photosensitive group into a polyimide precursor or a polyimide or a material obtained by mixing a compound having a photosensitive group with a polyimide precursor.

As examples of the former, Japanese patent publication No. Sho 55-41422 proposes a process for preparing the polyimide by imparting a photosensitive group to the side chain of a polyamic ester and Japanese paten laid-open No. Sho 60-6729 proposes a process for preparing the polyimide by preparing a diamine having a double bond in advance, followed by preparing the polyimide using the diamine. However, in the case of these processes, the process of introducing the functional group is complicated and a high cost is required.

Further, Japanese patent application laid-open Nos. Sho 55-45746 and Sho 60-100143 each propose a process of reacting an unsaturated epoxy compound or a double bond-containing isocyanate compound with the carboxyl group of a polyamic acid, but the process has a drawback that when the unsaturated group-containing compound is reacted with the carboxyl group of the polyamic acid, a portion of the polyamic acid decomposes to lower the solution viscosity.

As examples of the latter, i.e. mixture of a photosensitive group-containing compound with a polyimide precursor, Japanese patent application laid-open Nos. Sho 63-206741, Sho 59-15449 and Hei 2-144539 propose a composition obtained by mixing a polyamic acid with a photoreactive, unsaturated group-containing compound, but since such unsaturated group-containing compounds are usually inferior in the compatibility with polyamic acid, practically the use conditions and the kinds of the unsaturated group-containing compound or polyamic acid are restricted; hence the above compounds are difficultly used.

On the other hand, according to a process of mixing a compound containing a double bond and an amino group or its quatanary salt with a polyamic acid, as disclosed in Japanese patent application laid-open No.

Sho 54-145794, the compatibility is good, but there are problems of low sensitivity, occurrence of cracks at the time of development, etc. In Japanese patent application laid-open No. Hei 3-91752, there is used a polyfunctional aminoacrylate expressed by the formula

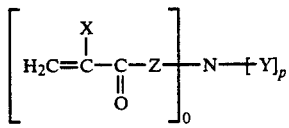

wherein X represents —H or —CH$_3$ group, Y represents —CH$_3$, —C$_2$H$_5$, —C$_3$H$_7$ or —Ph group, Z represents —C$_2$H$_4$—, —C$_3$H$_6$— or —CH$_2$CHOHCH$_2$— group, o represents an integer of 2 to 3, p represents an integer of 0 to 1 and o+p=3, and the sensitivity and cracks at the time of development have been improved, but such a polyfunctional aminoacrylate is difficultly obtained as a commercially available product and also the width of choice of monomer as synthesizing material is limited to a narrow range.

The present inventors have made extensive research in order to find a photosensitive cover coating agent satisfying all of the required properties for many items, and as a result, have found that a photosensitive cover coating agent consisting of a polyamic acid mentioned below, a specified polyfunctional monomer and a photopolymerization initiator or a sensitizing agent is superior in the compatibility, sensitivity, heat resistance, adhesion, electrical properties and flexibility.

As apparent from the foregoing, the object of the present invention is to provide a photosensitive cover coating agent forming an insulating protective coating superior in the compatibility, sensitivity, heat resistance, adhesion, electrical properties and flexibility.

SUMMARY OF THE INVENTION

The present invention consists in a photosensitive cover coating agent obtained by mixing
a polymer (A) comprising repetition units expressed by the formula (I)

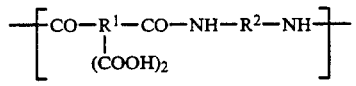

wherein R$^1$ represents

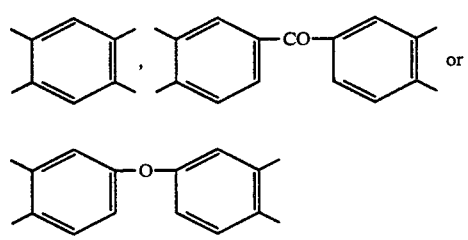

and R$^2$ represents a divalent organic group,
a compound (B) having two or more acryloyl groups or methacryloyl groups in one molecule,
a compound (C) expressed by the formula (II)

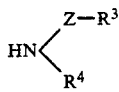

wherein Z represents a divalent aliphatic group or alicyclic group, R$^3$ represents a hydrogen atom, a monovalent organic group or a characteristic group and R$^4$ represents a hydrogen atom or —Z—R$^3$, in 0.01 to 0.80 molar equivalent based upon the compound (B), the total quantity of (B) and (C) being 20 to 200 parts by weight based upon 100 parts by weight of (A), and
a photopolymerization initiator or a sensitizing agent (D) in a quantity of 0.5 to 20 parts by weight based upon 100 parts by weight of (A).

DETAILED DESCRIPTION OF THE INVENTION

The constitution and effectiveness of the present invention will be described in detail.

The polyamic acid used in the photosensitive cover coating agent of the present invention is obtained by reacting an organic tetracarboxylic dianhydride with an organic diamine, and the reaction is usually carried out in an organic solvent. The reaction of obtaining the polyamic acid is an exothermic reaction, and it is preferable to control the reaction under cooling, if necessary. Further, there is also preferable a process of suspending or dissolving either one of a tetracarboxylic anhydride and a diamine in an organic solvent, followed by reacting while adding the other, and even if either one of the two components is used in an excess quantity within a range of 10:9 to 9:10, there is no problem.

The tetracarboxylic dianhydride is expressed by the formula (III)

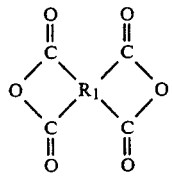

wherein R$_1$ represents

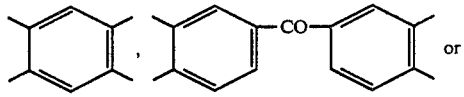

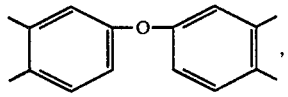

and used alone or in a combination of two kinds or more thereof.

Concrete examples of the diamine are as follows, but it is not limited to these examples:
aromatic diamines such as 4,4'-diaminodiphenyl ether, 3,4'-diaminodiphenyl ether, 4,4'-diaminodiphenylmethane, 4,4'-diaminodiphenyl sulfone, 4,4'-diaminodiphenyl sulfide, 4,4'-di(m-aminophenoxy)diphenyl sulfone, 4,4'-di(p-aminophenoxy)diphenyl sulfone, o-phenylenediamine, m-phenylenediamine, p-phenylenediamine, benzidine, 3,3'-diaminobenzophenone, 4,4'-diaminobenzophenone, 4,4'-diaminodiphenyl-2,2-propane, 1,5-diaminonaphthalene, 1,8-diaminonaphthalene, 4,4'-bis(4-aminophenoxy)biphenyl, 2,2'-bis{4-(4-aminophenoxy)phenyl}-hexafluoropropane, 1,4-bis(4-aminophenoxy)benzene, 1,3-bis(4-aminophenoxy)benzene, 4,4'-diamino-3,3'-diethyl-5,5'-dimethyldiphenylmethane, 4,4'-diamino-3,3',5,5'-tetramethyldiphenylmethane, 1,4-diaminotoluene, m-xylylenediamine, 2,2'-dimethylbenzidine, 3,4'-diaminobenzanilide, 4,4'-diaminobenzanilide, etc., aliphatic diamines such as trimethylenediamine, tetramethylenediamine, hexamethylenediamine, 2,11-dodecanediamine, etc., silicon diamines such as bis(p-aminophenoxy)dirutilesilane, 1,4-bis(3-aminopropyldimethylsilyl)benzene, etc., alicyclic diamines such as 1,4-diaminocyclohexane, bis(4-aminocyclohexyl)methane, isophoronediamine, etc., guanamines such as acetoguanamine, benzoguanamine, etc.

These are used alone or in a combination of two kinds or more thereof.

Examples of the solvent used for the reaction of the tetracarboxylic dianhydride with the diamine to form the polyamic acid are
N,N-dimethylformamide, N,N-diethylformamide, N-methyl-2-pyrrolidone, N,N-dimethylacetamide, N-methylcaprolactam, dimethyl sulfoxide, hexamethylphosphoamide, tetramethylenesulfone, tetramethylurea, γ-butyrolactone, N-acetyl-2-pyrrolidone, phenol, cresols, nitro compounds, chlorine solvents such as chloroform, methylene chloride, etc., cellosolves, carbitols, etc.

Further, in some cases, a general-purpose solvent such as benzene, toluene, xylene, etc. may be added to the above solvents.

Further, in order to improve adhesion onto the base, it is possible to introduce into the terminal of the polymer, an aminosilane expressed by the formula $$H_2N-R^5-SiR^6{}_{3-k}Y_k$$

wherein $R^5$ represents $-(CH_2)_s-$, $-(CH_2)_s-$(phenylene group)$-(CH_2)_s-$o$-$(phenylene group)- or -(phenylene group)—wherein s represents an integer of 1 to 4, $R^6$ independently represents an alkyl group of 1 to 6 carbon atoms, phenyl group or an alkyl-substituted phenyl group of 7 to 12 carbon atoms, Y independently represents a hydrolyzable alkoxy group, an acetoxy group or a halogen atom and k has a value of $1 \leq k \leq 3$.

Examples of such an aminosilane are the following known compounds, but it is not always limited these examples:
aminomethyl-di-n-propoxy-methylsilane,
(β-aminoethyl)-n-propoxy-methylsilane,
(β-aminoethyl)-diethoxy-phenylsilane,
(β-aminoethyl)-tri-n-propoxysilane,
(β-aminoethyl)-dimethoxy-methylsilane,
(γ-aminopropyl)-di-n-propoxy-methylsilane,
(γ-aminopropyl)-di-n-butoxy-methylsilane,
(γ-aminopropyl)-triethoxysilane,
(γ-aminopropyl)-di-n-pentoxy-phenylsilane,
(γ-aminopropyl)-methoxy-n-propoxy-methylsilane,
(δ-aminobutyl)-dimethoxy-methylsilane,
(3-aminophenyl)-di-n-propoxysilane,
(4-aminophenyl)-tri-n-propoxysilane,
{β-(4-aminophenyl)ethyl}-diethoxy-methylsilane,
{β-(3-aminophenyl)ethyl}-di-n-propoxy-phenylsilane,
{γ-(4-aminophenyl)propyl}-di-n-propoxy-methylsilane,
{γ-(4-aminophenoxy)propyl}-di-n-propoxy-methylsilane,
{γ-(3-aminophenoxy)propyl}-di-n-butoxy-methylsilane,
{γ-(3-aminophenoxy)propyl}-dimethyl-methoxysilane,
(γ-aminopropyl)-methyl-diethoxysilane,
(γ-aminopropyl)ethyl-di-n-propoxysilane,
(4-aminophenyl)-trimethoxysilane,
(3-aminophenyl)-trimethoxysilane,
(4-aminophenyl)-methyl-dimethoxysilane,
(3-aminophenyl)-dimethyl-methoxysilane,
(4-aminophenyl)-triethoxysilane, etc.

Besides the above compounds, it is also possible for controlling the molecular weight of the polyamic acid to add a monofunctional acid anhydride or amine and carry out reaction. Examples of such compounds are phthalic anhydride, maleic anhydride, aniline, monoallylamine, etc.

As to the viscosity of the resulting polymer, it is preferred to adjust the viscosity to a viscosity of 500 to 100,000 cp., preferably 5,000 to 50,000 cp. as measured by E type viscometer (Rotar 3°×R14).

As to the compound (B) having two or more acryloyl groups or methacryloyl groups in one molecule, used for the photosensitive cover coating agent, the other parts than acryloyl groups or methacryloyl groups are not particularly limited, and compounds having various structures may be used. Most of them are easily obtained as commercially available products.

Examples of a part of such compounds are the following compounds, but they are not always limited to the examples:
1,4-butanediol diacrylate, 1,4-butanediol dimethacrylate, 1,6-hexanediol diacrylate, 1,6-hexanediol dimethacrylate, ethylene glycol diacrylate, ethylene glycol dimethacrylate, neopentyl glycol diacrylate, neopentyl glycol dimethacrylate, diethylene glycol diacrylate, diethylene glycol dimethacrylate, triethylene glycol diacrylate, triethylene glycol dimethacrylate, polyethylene glycol diacrylate, polyethylene glycol dimethacrylate, hydroxypivalic acid neopentyl glycol diacrylate, hydroxypivalic acid neopentyl glycol dimethacrylate, trimethylolpropane triacrylate, trimethylolpropane trimethacrylate, ethoxidized trimethylolpropane triacrylate, ethoxidized trimethylolpropane trimethacrylate, ditrimethylolpropane tetracrylate, ditrimethylolpropanetetramethacrylate, pentaerythritol triacrylate, pentaerythritol trimethacrylate, dipentaerythritol hexaacrylate, dipentaerythritol hexamethacrylate, dicyclopentanyl diacrylate, dicyclopentanyl dimethacrylate, ethoxidized hydrogenated bisphenol A diacrylate, ethoxidized hydrogenated bisphenol A dimethacrylate, ethoxidized bisphenol A diarylate, ethoxidized bisphenol A dimethacrylate, ethoxidized bisphenol F diacrylate, ethoxidized bisphenol F dimethacrylate, ethoxidized bisphenol S diacrylate, ethoxidized bisphenol S dimethacrylate, hydroxypropyl diacrylate, hydroxypropyl dimethacrylate, diethylene glycol bis(hydroxypropyl acrylate), diethylene glycol bis(hydroxypropylmethacrylate), monohydroxypentaerythritol triacrylate, monohydroxypentaerythritol trimethacrylate, etc.

These compounds may be use alone or in admixture. At that time, the preferable number of acryloyl groups or methacryloyl groups is 4 or less, more preferably 2, in one molecule.

As to compounds having two or more acryloyl groups or methacryloyl groups, when the amino compound expressed by the formula (II) is added thereto, the amino compound is Michael-added to a part thereof, to thereby improve the compatibility with the polyamic acid and also improve the sensitibity. On the other hand, when the number of the acryloyl group or methacryloyl group is less than 2, no sufficient sensitivity is obtained.

As to the compound (C) expressed by the formula (II), Z in the formula (II) is an aliphatic group or an alicyclic group and the atoms of carbon number is preferably 1 to 10. $R^3$ is hydrogen atom or a monovalent organic group, and when $R^3$ is organic, it is preferably an aliphatic group, an alicyclic group, an aromatic group or an araliphatic group of 1 to 10 carbon atoms. However, an unsaturated bond or a hydroxyl group, carboxyl group, ether, amide, ester, ketone, etc. may be contained in one molecule. When $R^3$ is a characteristic group, hydroxyl group, carboxyl group, amide group and nitrile group are preferred.

Further, as to the compound (C) expressed by the formula (II), the case where $R^3$ is hydroxyl group is particularly preferable, because the adhesion of the film onto the base at the time of development is superior. $R_4$ is a hydrogen atom or $-Z-R^3$. When $R^4$ is a hydrogen atom, a product having a higher sensitivity is obtained; hence $R^4$ is preferably a hydrogen atom.

Examples of the compound (C) expressed by the formula (II) are the following amino compounds, but it is not limited to the examples:

$$H_2N-CH_2CH_2CH_3, H_2N-CH_2CH_2CH_2CH_3,$$

$$H_2N-CH_2CH_2CH_2CH_2CH_2CH_3$$

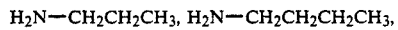

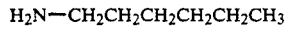

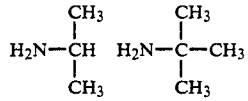

$$H_2N-CH_2-OH, H_2N-CH_2CH_2-OH$$

$$H_2N-CH_2CH_2CH_2CH_2-OH$$

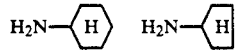

$$H_2N-CH_2CH_2OCH_2CH_2-OH$$

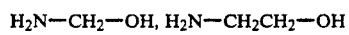

$$H_2N-CH_2CH_2CH_2CH_2-COOH$$

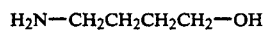  $H_2N-CH_2CH_2-CN$

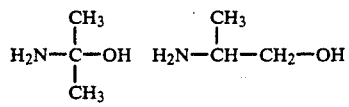

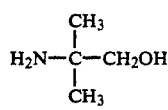

The quantity of the compound (C) added is 0.01 to 0.80 molar equivalent based upon the compound (B). If it is less than 0.01 molar equivalent, the compatibility of the polyamic acid with the compound having acryloyl groups or methacryloyl groups is inferior and the sensitivity is low. If it exceeds 0.50 molar equivalent, the developing properties, the sensitivity and the stability of the photosensitive cover coating agent with lapse of time become inferior. Further, the total quantity of the compound (B) and the compound (C) is 20 to 200 parts by weight based upon 100 parts by weight of the polymer (A). If the quantity is less than 20 parts by weight, the sensitivity is low, while if it exceeds 200 parts by weight, the quality of the polyimide film as the final product becomes inferior.

The compound having acryloyl groups or methacryloyl groups and the amino compound are mixed in the polyamic acid solution, or they are mixed in a solvent or without any solvent in advance, followed by adding to and mixing with the polyamic acid solution. At that time, heat generation often occurs; thus, in order to prevent decomposition of the polyamic acid and thermal polymerization of the compound having acryloyl groups or methacryloyl groups, cooling down to 70° C. or lower is preferred.

As the photopolymerization initiator or sensitizer (D), the following compounds may be used alone or in admixture:

benzophenone Michler's ketone, 4,4'-diethylaminobenzophenone, xanthone, thioxanthone, isopropylxanthone, 2,4-diethylthioxanthone, 2-ethylanthraquinone, acetophenone, 2-hydroxy-2-methylpropiophenone, 2-hydroxy-2-methyl-4'-isopropylpropiophenone, 1-hydroxycyclohexyl phenyl ketone, isopropylbenzoin ether, isobutylbenzoin ether, 2,2-diethoxyacetophenone, 2,2-dimethoxy-2-phenylacetophenone, benzyl, camphorquinone, benzanthrone, 2-methyl-1-[4-(methylthio)phenyl]-2-morpholino-1-propane, 3,3',4,4'-tetra(t-butylperoxycarbonyl)benzophenone, N-phenylglycine, p-hydroxy-N-phenylglycine, tetramethylthiuram monosulfide, tetramethylthiuram disulfide, p-tolyl disulfide, ethyl 4-dimethylaminobenzoate, isoamyl 4-dimethylaminobenzoate, 3,3'-carbonyl-bis(7-diethylamino)cumarin, etc., but the compound (D) is not always limited to these.

The quantity of the photopolymerization initiator or sensitizer added is 0.05 to 20 parts by weight based upon 100 parts by weight of the polymer. If it is less than 0.05 part by weight, its effect is poor, while if it exceeds 20 parts by weight, the film quality becomes inferior. Its preferable quantity added is 0.5 to 10 parts by weight.

Besides the above, in order to control the viscosity and developing properties of the solution, it is also possible to mix the compound having two or more acryloyl groups or methacryloyl groups with the amino compound, and add a compound having a monofunctional C—C double bond. Examples of such a compound are as follows:

butyl acrylate, cyclohexyl acrylate, dimethylaminoethyl methacrylate, benzyl acrylate, carbitol acrylate, 2-ethylhexyl acrylate, 2-ethylhexyl methacrylate, lauryl methacrylate, 2-hydroxyethyl acrylate, 2-hydroxyethyl methacrylate, 2-hydroxypropyl acrylate, 2-hydroxypropyl methacrylate, glycidyl methacrylate, N-methylolacrylamide, diacetone acrylamide, N-vinylpyrrolidone, etc.

Further, in order to improve the sensitivity, it is also possible to add 0.5 to 20 parts by weight of a bisazido compound such as 2,6-bis(p-azidobenzylidene)cyclohexanone, 2,6-bis(p-azidobenzylidene)-4-methylcyclohexanone, 2,6-bis(p-azidobenzylidene)-4-tert-butylcyclohexane, etc. to 100 parts by weight of the polymer (A).

A concrete example of the case wherein the photosensitive cover coating agent composition of the present invention is used, will be described below.

Firstly, by adding the above respective component (A), (B), (C) and (D) and if desired, further adding a monofunctional compound having a C—C double bond, the photosensitive cover coating agent of the present invention is obtained.

The photosensitive cover coating agent of the present invention is usually applied in the form of a solution. The solution is coated onto the total surface of the printed circuit base according to a known method such as roll coating method, doctor knife method, comma coater method, spray coating method, screen printing method, etc., followed by baking the resulting material in an oven to remove most of the solvent in the coating.

Next, a negative mask is put on the coating, followed by irradiation with chemical rays. Examples of the chemical rays are X-rays, electronic rays, ultraviolet rays, visible rays, etc., and ultraviolet rays are particularly preferable.

Thereafter, when development and water washing are carried out using a suitable alkali aqueous solution, unexposed part is selectively dissolved and removed to afford a relief pattern faithful to the mask pattern.

As the developer, for example, an aqueous solution of NaOH, KOH, $Na_2CO_3$, tetramethylammonium hydroxide, trimethylhydroxyethyl ammonium hydroxide or the like is usable, and if necessary, an alcohol, a surfactant or the like is further added to the above.

The finally obtained pattern is baked at 200° to 250° C. to afford the objective insulating protective coating of a printed wiring board having superior heat resistance, flexibility, adhesion, electrical properties, etc.

EXAMPLE

The present invention will be described in more detail by way of Examples, but it should not be construed to be limited thereto.

REFERENCE EXAMPLE 1 (PREPARATION OF POLYAMIC ACID)

A 2 l capacity, four-neck, separable flask provided with a stirrer, a thermometer and a nitrogen gas-purging means was fixed on a water bath. To this flask was added dehydrated and purified N-methyl-2-pyrrolidone (600 ml) in a nitrogen gas current. Further, to the flask was added 4,4'-diaminodiphenyl ether (60.46 g, 302.0 mmol), followed by suspending and dissolving together. Next, pyromellitic dianhydride (65.87 g, 302.0 mmol) was gradually added and the mixture was agitated at 20° C. for 5 hours.

The thus obtained polyamic acid solution had a viscosity of 39,000 cp as measured under conditions of a solids concentration of 17% by weight and an E type viscometer:rotor 3°×R14, 20 rpm (hereinafter this viscometer being employed).

REFERENCE EXAMPLE 2 (PREPARATION OF POLYAMIC ACID)

Employing the same apparatus and method as in Reference example 1, 4,4'-diaminodiphenyl ether (24.84 g, 124.01 mmol) and 4,4'-diaminobenzanilide (28.16 g, 124.01 mmol) were suspended and dissolved in dehydrated and purified N,N-dimethylacetamide (600 ml), followed by adding pyromellitic dianhydride (54.05 g, 248.02 mmol), and reacting the mixture at 20° C. for 7 hours.

The thus obtained polyamic acid solution had a solids concentration of 16% by weight and a viscosity of 12,000 cp as measured by the E type viscometer.

REFERENCE EXAMPLE 3 (PREPARATION OF POLYAMIC ACID)

Employing the same apparatus and method as in Reference example 1, 4,4'-diaminodiphenyl ether (20.85 g, 104.13 mmol) and p-phenylenediamine (11.26 g, 104.13 mmol) were suspended and dissolved in dehydrated and purified N,N-dimethylacetamide (600 ml), followed by adding 3,3',4,4'-benzophenonetetracarboxylic dianhydride (67.10 g, 208.26 mmol) and reacting the mixture at 20° C. for 5 hours.

The thus obtained polyamic acid solution had a solids concentration of 15% by weight and a viscosity of 25,000 cp as measured by the E type viscometer.

REFERENCE EXAMPLE 4 (PREPARATION OF POLYAMIC ACID)

Employing the same apparatus and method as in Reference example 1, 4,4'-diaminodiphenyl ether (60.49 g, 302.10 mmol) was suspended and dissolved in dehydrated and purified N-methyl-2-pyrrolidone (600 ml), followed by adding 4,4'-oxydiphthalic anhydride (93.71 g, 302.10 mmol) and reacting the mixture at 20° C. for 5 hours.

The thus obtained polyamic acid solution had a solids concentration of 20% by weight and a viscosity of 9,000 cp as measured by the E type viscometer.

REFERENCE EXAMPLE 5 (PREPARATION OF POLYAMIC ACID)

Employing the same apparatus and method as in Reference example 1, 4,4'-diaminodiphenyl ether (44.08 g, 220.14 mmol) was suspended and dissolved in dehydrated and purified N-methyl-2-pyrrolidone (600 ml), followed by adding 3,3',4,4'-biphenyltetracarboxylic dianhydride (64.77 g, 220.14 mmol) and reacting the mixture at 20° C. for 5 hours.

The thus obtained polyamic acid solution had a solids concentration of 15% by weight and a viscosity of 50,000 cp as measured by the E type viscometer.

EXAMPLE 1

Polyethylene glycol 400 diacrylate (PEG-400DA, trade name of product made by Nihon Kayaku Co., Ltd.) (100 g) and ethanolamine (4.0 g) were mixed with stirring at 30° C., for one hour, followed by mixing the polyamic acid solution (100 g) obtained in Reference example 1, the mixed solution (17 g) obtained above, Michler's ketone (0.85 g) and 2,4-diethylthioxanthone (Kayacure-DETX, trademark of product made by Nihon Kayaku Co., Ltd.) (0.85 g), with stirring and dissolving them together, to obtain the photosensitive cover coating agent of the present invention.

The thus obtained solution was coated onto a flexible copper-lined sheet (a polyimide base of 30 μm thick) by means of Baker's applicator, followed by heat-treating the resulting sheet in an oven at 100° C. for 10 minutes and then subjecting the heat-treated sheet to exposure to ultraviolet light by means of a mercury lamp, vacuum, both surfaces-exposing machine (MPL-S, trade name of product made by Print Denshi Sogyo Co., Ltd.) fitted with a high pressure mercury lamp (HL-10201 BF, trade name of product made by Ushio Denki Co., Ltd.), through a test photomask. The resulting material was developed with a 5% $Na_2CO_3$ aqueous solution for one minute, followed by rinsing it with purified water for one minute, drying in an oven at 100° C. for 10 minutes, further elevating the temperature up to 240° C. to carry out heat treatment for 30 minutes. The resulting coating was subjected to measurements of coating thickness before the development, developing properties, sensitivity, heat resistance, flexibility, adhesion and electrical properties. The results are shown in Table 1.

As to the developing properties, when the development was carried out in a 5% $Na_2CO_3$ aqueous solution for one minute, followed by rinsing with purified water for one minute, a coating having an unexposed part completely removed was regarded as good, while a coating having a residual coating or a scum left behind was regarded as inferior. As to the sensitivity, a coating obtained in an exposed dose (measured at 365 nm) of 500 mJ/cm$^2$ or less, affording a value of 0.5 when the coating thickness after the development was specified with that before the development, was regarded as good, while a coating obtained in an exposed dose exceeding 5,000 mJ/cm$^2$ was regarded as inferior.

As to the flexibility, to what extent the folding endurance of a flexible, copper-lined sheet having a conductor pattern formed thereon and having a coating was improved over that of a flexible, copper-lined sheet having a conductor pattern formed thereon but having no coating, was expressed in terms of the ratio of the numbers of the times of breakage. As to the measurement conditions, there was measured the number of times at the time when the conducting of the circuit was broken under conditions of use of MIT type fold tester, a flex speed of 180 times/min., a tension of 500 g f, a curvature radius of 0.38 mm and a folding angle of 135° (270° when reciprocated). As the conductor pattern of the flexible copper-lined sheet (polyimide base thickness:60 μm) having no coating, a conductor pattern having formed a conductor in one reciprocation of a conductor width of 1.5 mm and a clearance of 1.0 mm, by etching, was used. As the conductor pattern of the flexible copper-lined sheet having a coating, a conductor pattern having formed a cover coating film on the conductor pattern of the flexible copper-lined sheet having no coating was used.

As to the heat resistance, when the coating was floated on a solder bath at 280° C. for 60 seconds, the peeling, buldge and discoloration of the coating were judged by naked eyes, and a coating having no change observed between before and after the test was regarded as good, while a coating having any change observed was regarded as inferior.

The adhesion was evaluated based upon JIS K 5400 and according to the judgement standards of Japan Paint Engineering Association (Foundation). Namely, a section of 1 cm square was divided by lines each having an interval of 1 mm longitudinally and laterally, and only the coating was cut by means of a cutter knife so as to give 100 sections of 1 mm square along these lines and nicks were provided so that the base could not be cut. Next, a cellophane tape was applied onto the nicked coating, followed by pulling up the tape at an angle of 90°, and evaluating the adhesion by counting what number of the sections of 1 mm square were peeled off at that time. A coating without any peeling and any deficit in the respective sections was regarded as good, while a coating having one or more peelings and having a deficit was regarded as inferior.

As to the electrical properties, according to JIS K6481, a parallel pattern having a distance between lines of 1.0 mm and a total extended length of 80 mm was formed by etching, followed by impressing a DC of 100 V onto the pattern and observing an insulating resistance between lines after lapse of one minute. The value of this insulating resistance is shown as the electrical properties in Table 1.

EXAMPLE 2

EO-modified bisphenol F diacrylate (Kayarad R-712, trademark of product made by Nihon Kayaku Co., Ltd.) (12.95 g) and n-butylamine (0.65 g) were added to the polyamic acid solution (100 g) obtained in Reference example 1, followed by mixing them with stirring at 30° C. for 2 hours, further adding Michler's ketone (0.31 g) and 2,2-dimethoxy-2-phenylacetophenone (1.53 g) and mixing them and dissolving together to obtain a photosensitive cover coating agent of the present invention.

Measurements were carried out in the same manner as in Example 1. The results are shown in Table 1.

EXAMPLE 3

Oligo ester diacrylate (M-6100, trade name of product made by Toa Gosei Kagaku Kogyo Co., Ltd.) (100 g) and ethanolamine (4.0 g) were mixed with stirring at 30° C. for one hour, followed by mixing, agitating and dissolving together the polyamic acid solution (100 g) obtained in Reference example 2, the above-mentioned mixed solution (16 g), 3,3',4,4'-tetra(t-butylperoxycarbonylbenzophenone) (BTTB, trade name of product made by Nihon Yushi Co., Ltd.) (0.8 g) and 2,4-diethylthioxanthone (Kayacure-DETX, trademark of product made by Nihon Kayaku Co., Ltd.) (0.80 g) to obtain a photosensitive cover coating agent of the present invention.

Measurements were carried out in the same manner as in Example 1. The results are shown in Table 1.

EXAMPLE 4

Neopentyl glycol-modified trimethylolpropane diacrylate (R-604, trade name of product made by Nihon Kayaku Co., Ltd.) (80 g), pentaerythritol triacrylate (made by Kokusan Kagakusha Co., Ltd.) (20 g) and ethanolamine (5 g) were mixed with stirring at 30° C. for one hour, followed by mixing, agitating and dissolving together the polyamic acid solution (100 g) obtained in Reference example 3, the above-mentioned mixed solution (15 g), isopropylthioxanthone (Quantacure-ITX, trademark of product made by Ward Blenkinsop Co., Ltd.) (0.60 g) and 2-methyl-1-[4-methylthio)phenyl]-2-morpholino-1-propane (Irgacure-907, trademark of product made by Ciba Geigy Co., Ltd.) (0.60 g) to obtain a photosensitive cover coating agent of the present invention.

Measurements were carried out in the same manner as in Example 1. The results are shown in Table 1.

EXAMPLE 5

Polyethylene glycol 400 diacrylate (PEG-400DA, trade name of product made by Nihon Kayaku Co., Ltd.) (9.43 g), oligo ester diacrylate (M-6100, trade name of product made by Toa Gosei Kagaku Co., Ltd.) (9.43 g) and 1-amino-2-propanol (1.14 g) were added to the polyamic acid solution (100 g) obtained in Reference example 4, followed by mixing them with stirring at 30° C. for 2 hours and further adding, mixing and dissolving together Michler's ketone (1.0 g) and 2,4-diethylthioxanthone (1.0 g) to obtain a photosensitive cover coating agent of the present invention.

Measurements were carried out in the same manner as in Example 1. The results are shown in Table 1.

COMPARATIVE EXAMPLE 1

Polyethylene glycol 400 diacrylate (PEG-400DA, trade name of product made by Nihon Kayaku Co., Ltd.) (100 g) and ethanolamine (4.0 g) were mixed with stirring at 30° C. for one hour, followed by mixing, agitating and dissolving together the polyamic acid solution (100 g) obtained in Reference example 5, the above-mentioned mixed solution (15 g), Michler's ketone (0.75 g) and 2,4-diethylthioxanthone (Kayacure-DETX, trademark of product made by Nihon Kayaku Co., Ltd.) (0.75 g) to obtain a photosensitive cover coating agent.

Measurements were carried out as in Example 1. As a result, the developing properties were inferior and there was a residual coating at the unexposed part.

COMPARATIVE EXAMPLE 2

EO-modified bisphenol F diacrylate (Kayarad R-712, trademark of product made by Nihon Kayaku Co., Ltd.) (16.0 g), Michler's ketone (0.8 g) and 2,2-dimethoxy-2-phenylacetophenone (0.8 g) were added to the polyamic acid solution (100 g) obtained in Reference example 2, followed by mixing them and dissolving together to obtain a photosensitive cover coating agent.

Measurements were carried out in the same manner as in Example 1. As a result, since the compatibility of the polyamic acid with the compound having acryloyl groups was inferior, when coating was carried out, followed by heat treatment at 100° C. for 10 minutes, bleed occurred on the surface of the coating. Further, the sensitivity was low. The results are shown in Table 1.

COMPARATIVE EXAMPLE 3

Dimethylaminoethyl methacrylate (13.50 g), Michler's ketone (0.76 g) and 2,4-diethylxanthone (kayacure-DETX, trademark of product made by Nihon Kayaku Co., Ltd.) (0.76 g) were mixed with the polyamic acid solution (100 g) obtained in Reference example 1, followed by agitating the mixture and dissolving together to obtain a photosensitive cover coating agent.

Measurements were carried out in the same manner as in Example 1. As a result, the sensitivity was low. The results are shown in Table 1.

TABLE 1

| | Coating thickness (μm) | Developing properties | Sensitivity | Flexibility (times) | Heat resistance | Adhesion | Electrical properties (Ω) |
|---|---|---|---|---|---|---|---|
| Example | | | | | | | |
| 1 | 26 | Good | Good | 2.2 | Good | Good | $1.0 \times 10^{13}$ |
| 2 | 25 | Good | Good | 2.0 | Good | Good | $1.5 \times 10^{13}$ |
| 3 | 28 | Good | Good | 1.5 | Good | Good | $5.5 \times 10^{12}$ |
| 4 | 24 | Good | Good | 1.3 | Good | Good | $8.2 \times 10^{12}$ |
| 5 | 25 | Good | Good | 1.8 | Good | Good | $1.2 \times 10^{13}$ |
| Comp. example | | | | | | | |
| 1 | 21 | Bad | — | — | — | — | — |
| 2 | 24* | Good | Bad | — | — | — | — |
| 3 | 25 | Good | Bad | — | — | — | — |

Note:
*shows that after soft baking, bleed occurred on the film surface.

EFFECTIVENESS OF THE INVENTION

As apparent from the foregoing, the photosensitive cover coating agent of the present invention can be easily prepared using cheap materials, and is superior in the compatibility of the materials with one other, sensitivity, heat resistance, flexibility, adhesion and electrical properties; hence it is very useful as an insulating protective coating for flexible circuit bases.

What we claim is:

1. A photosensitive cover coating agent obtained by mixing a polymer (A) comprising repetition units expressed by the formula

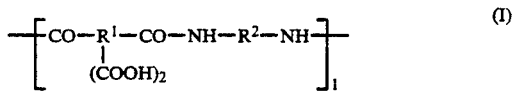
(I)

wherein R¹ represents

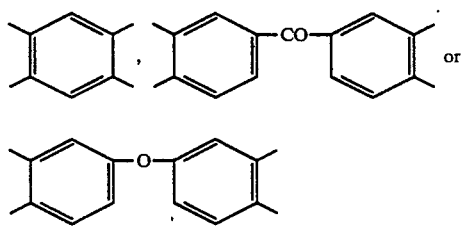

and R² represents a divalent organic group, a compound (B) having two or more acryloyl groups or methacryloyl groups in one molecule, a compound (C) expressed by the formula (II)

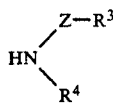

wherein Z represents a divalent aliphatic group or alicyclic group, $R^3$ represents a hydrogen atom, a monovalent organic group or a group represented by an aliphatic group, an alycyclic group, an aromatic group, an araliphatic group of 1 to 10 carbon atoms, an unsaturated bond, hydroxyl group, carboxyl group, ether, amide, ester or ketone and $R^4$ represents a hydrogen atom or $-Z-R^3$, in 0.01 to 0.80 molar equivalent based upon the compound (B), the total quantity of (B) and (C) being 20 to 200 parts by weight based upon 100 parts by weight of (A) and a photopolymerization initiator or a sensitizing agent (D) in a quantity of 0.5 to 20 parts by weight based upon 100 parts by weight of (A).

2. A photosensitive cover coating agent according to claim 1, wherein said $R^3$ represents a hydroxyl group.

3. A photosensitive cover coating agent according to claim 1, wherein said $R^3$ represents a hydroxyl group and $R^4$ represents a hydrogen atom.

* * * * *